(12) United States Patent
Quddus et al.

(10) Patent No.: US 9,716,151 B2
(45) Date of Patent: Jul. 25, 2017

(54) SCHOTTKY DEVICE HAVING CONDUCTIVE TRENCHES AND A MULTI-CONCENTRATION DOPING PROFILE THEREBETWEEN

(71) Applicant: Semiconductor Components Industries, LLC, Phoenix, AZ (US)

(72) Inventors: Mohammed Tanvir Quddus, Chandler, AZ (US); Mihir Mudholkar, Tempe, AZ (US); Mingjiao Liu, Gilbert, AZ (US); Michael Thomason, Blackfoot, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/160,273

(22) Filed: Jan. 21, 2014

(65) Prior Publication Data
US 2015/0084153 A1 Mar. 26, 2015

Related U.S. Application Data

(60) Provisional application No. 61/881,952, filed on Sep. 24, 2013.

(51) Int. Cl.
*H01L 29/872* (2006.01)
*H01L 29/36* (2006.01)
(Continued)

(52) U.S. Cl.
CPC ........ *H01L 29/36* (2013.01); *H01L 29/66143* (2013.01); *H01L 29/8725* (2013.01); *H01L 21/266* (2013.01); *H01L 21/2652* (2013.01)

(58) Field of Classification Search
CPC ............... H01L 29/36; H01L 29/66143; H01L 29/8725; H01L 29/48; H01L 29/872;
(Continued)

(56) References Cited

U.S. PATENT DOCUMENTS

| 4,982,260 A | 1/1991 | Chang et al. |
| 5,365,102 A | 11/1994 | Mehrotra et al. |

(Continued)

OTHER PUBLICATIONS

Wesley Chih-Wei Hsu, Florin Udrea, Pai-Li Lin, Yih-Yin Lin, Max Chen, Innovative Designs Enable 300-V TMBS with Ultra-low On-state Voltage and Fast Switching Speed, Proceedings of the 23rd International Symposium on Power Semiconductor Devices & IC's, May 23-26, 2011, pp. 80-83, IEEE, San Diego, CA.

(Continued)

*Primary Examiner* — Marc Armand
*Assistant Examiner* — Younes Boulghassoul
(74) *Attorney, Agent, or Firm* — Rennie William Dover

(57) ABSTRACT

A Schottky device includes a plurality of mesa structures where one or more of the mesa structures includes a doped region having a multi-concentration dopant profile. In accordance with an embodiment, the Schottky device is formed from a semiconductor material of a first conductivity type. Trenches having sidewalk and floors are formed in the semiconductor material to form a plurality of mesa structures. A doped region having a multi-concentration impurity profile is formed in at least one trench, where the impurity materials of the doped region having the multi-concentration impurity profile are of a second conductivity type. A Schottky contact is formed to at least one of the mesa structures having the dope region with the multi-concentration impurity profile.

20 Claims, 11 Drawing Sheets

(51) Int. Cl.
*H01L 29/66* (2006.01)
*H01L 21/265* (2006.01)
*H01L 21/266* (2006.01)

(58) Field of Classification Search
CPC . H01L 29/868; H01L 29/0634; H01L 29/456; H01L 27/095; H01L 21/2652; H01L 21/266; H01L 21/329
USPC ....... 257/475, 476, 471, 478, 510, 622, 328, 257/481, E29.338, E21.359, E29.262, 257/E29.148; 438/221, 478, 524, 570
See application file for complete search history.

(56) References Cited

U.S. PATENT DOCUMENTS

| | | | |
|---|---|---|---|
| 5,612,567 A | 3/1997 | Baliga | |
| 6,049,108 A * | 4/2000 | Williams | H01L 27/0255 257/155 |
| 6,078,090 A | 6/2000 | Williams et al. | |
| 6,184,563 B1 * | 2/2001 | Yu | H01L 21/76224 257/471 |
| 6,501,146 B1 * | 12/2002 | Harada | 257/475 |
| 6,537,921 B2 | 3/2003 | Metzler | |
| 6,633,071 B1 * | 10/2003 | Furio | H01L 29/456 257/383 |
| 7,045,397 B1 | 5/2006 | Yu et al. | |
| 8,766,317 B2 * | 7/2014 | Takaishi | H01L 29/7302 257/135 |
| 2003/0047776 A1 * | 3/2003 | Hueting | H01L 29/0696 257/328 |
| 2007/0145429 A1 | 6/2007 | Francis et al. | |
| 2009/0309181 A1 * | 12/2009 | Hsieh | H01L 29/0611 257/471 |
| 2012/0098082 A1 * | 4/2012 | Hsu et al. | 257/471 |
| 2012/0193676 A1 * | 8/2012 | Bobde | H01L 29/7391 257/140 |
| 2012/0241897 A1 * | 9/2012 | Qu | H01L 29/0619 257/475 |
| 2013/0207222 A1 * | 8/2013 | Qu | H01L 29/872 257/481 |
| 2014/0077287 A1 * | 3/2014 | Xu et al. | 257/328 |
| 2014/0084337 A1 * | 3/2014 | Matsudai | H01L 29/36 257/140 |
| 2014/0239435 A1 * | 8/2014 | Qu | H01L 29/66143 257/476 |
| 2016/0181391 A1 * | 6/2016 | Bobde | H01L 29/6609 438/270 |

OTHER PUBLICATIONS

Pierret Robert F. and Neudeck, Gerold W., The PN Junction Diode, Modular Series on Solid State Devices, vol. II, chapter 7/Metal-Semiconductor Contacts, 1989, pp. 127-146.
Sze, S.M. and Ng, Kwok K., Physics of Semiconductor Devices, Third Edition, 2007, pp. 162-166, 178-181, and 187-195.
Sze, S.M., Physics of Semiconductor Devices, Second Edition, 1981, pp. 304-307.

* cited by examiner

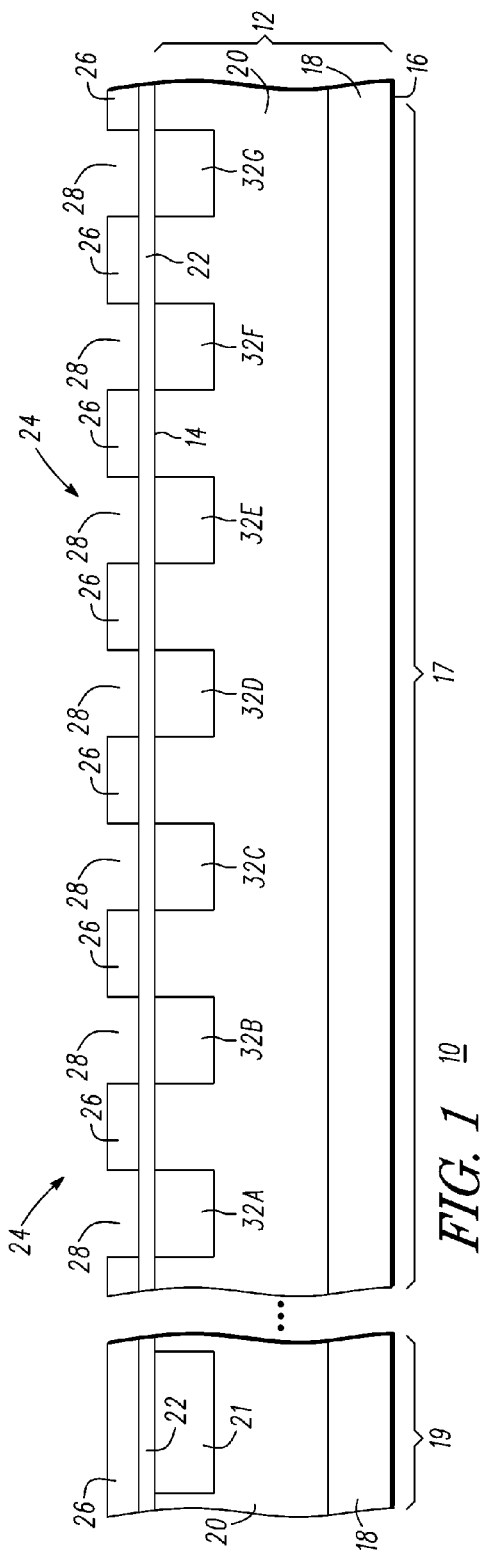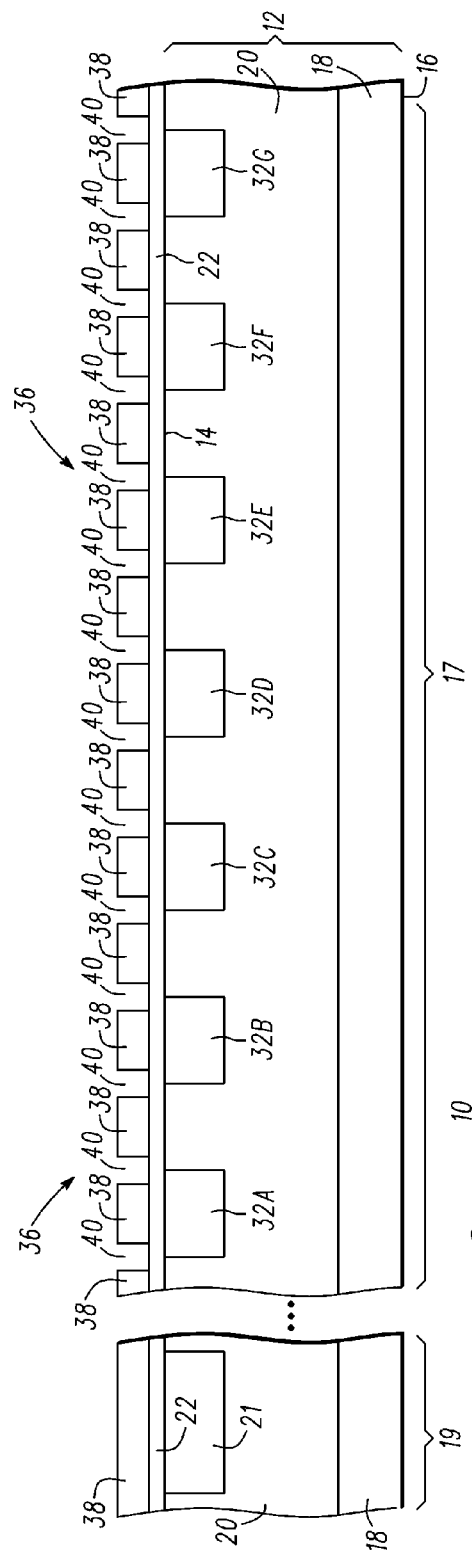

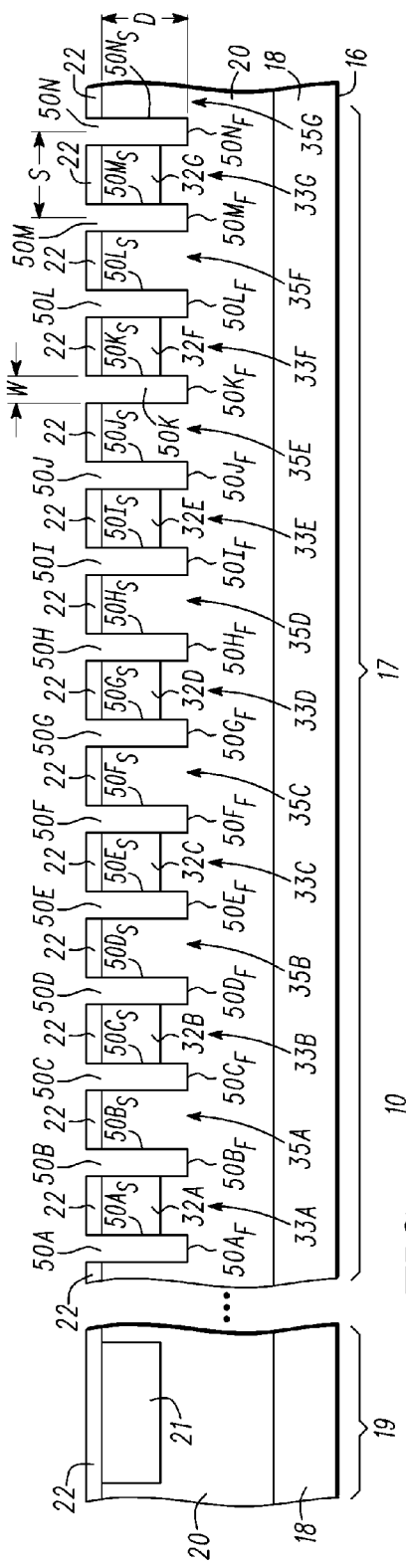
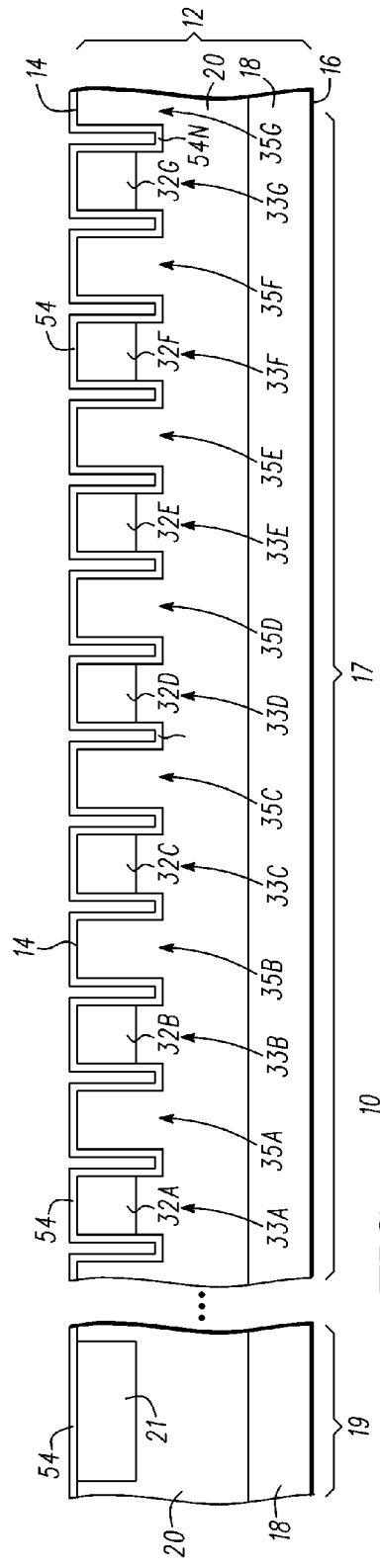
FIG. 3
FIG. 4

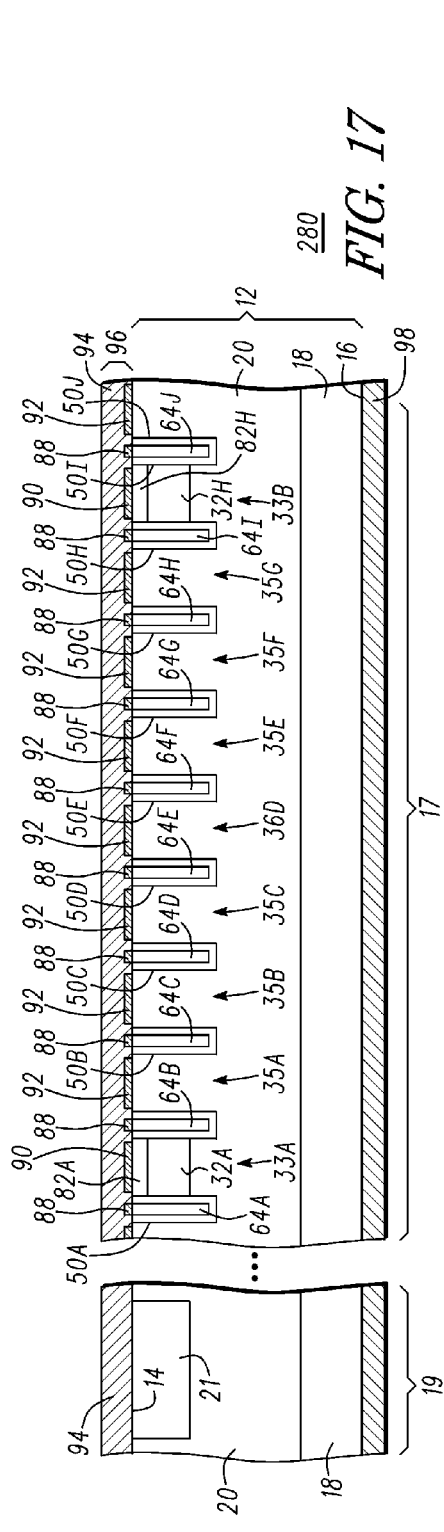
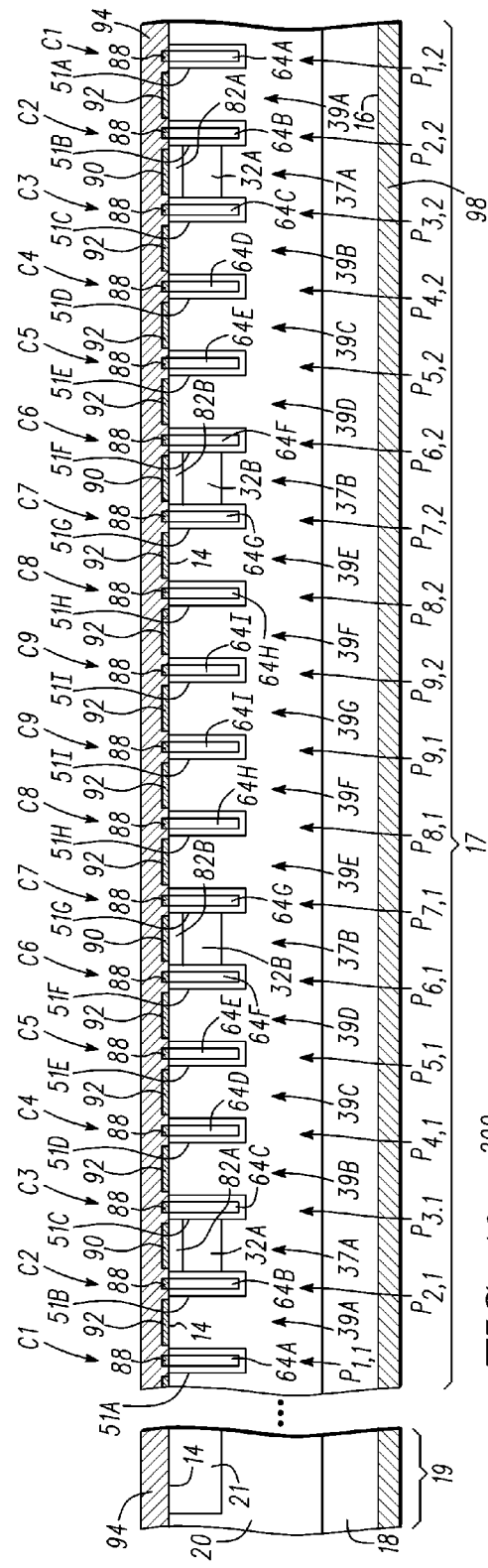

SCHOTTKY DEVICE HAVING CONDUCTIVE TRENCHES AND A MULTI-CONCENTRATION DOPING PROFILE THEREBETWEEN

TECHNICAL FIELD

The present invention relates, in general, to semiconductor components and, more particularly, to semiconductor components that include Schottky devices.

BACKGROUND

Semiconductor components such as a Schottky device are well suited for use in high frequency applications because they have short reverse recovery times and low forward voltages, i.e., low losses. Techniques for increasing the breakdown voltage of a Schottky device have resulted in an increase in its forward voltage and a decrease in its switching speed. Since the forward voltage drop of a Schottky device increases significantly in devices configured to support an increased breakdown voltage, Schottky devices may be limited to applications of less than 300 volts. Power rectifiers that improve the forward voltage drop, reverse leakage current, and switching speed of Schottky contact regions have been described in U.S. Pat. No. 4,982,260 issued to Hsueh-Rong Chang on Jan. 1, 1991. Trench-gated Schottky devices for protecting gate oxide from high electric fields and hot carrier generation have been described in U.S. Pat. No. 6,078,090 issued to Richard K. Williams on Jun. 20, 2000. A drawback with these techniques is that they increase the amount of silicon used to manufacture the Schottky devices, which increases cost. Other drawbacks with Schottky devices are that they have low reverse blocking capabilities, high current leakage characteristics, and high forward voltage drops.

Accordingly, it would be advantageous to have Schottky devices that offer fast switching and soft recovery characteristics with a high voltage blocking capability, a low leakage current, and a low forward voltage drop. It would be of further advantage for the method of manufacturing the Schottky devices to be cost efficient, time efficient, and compatible with Schottky device manufacturing processes.

BRIEF DESCRIPTION OF THE DRAWINGS

The present invention will be better understood from a reading of the following detailed description, taken in conjunction with the accompanying drawing figures, in which like reference characters designate like elements and in which:

FIG. 1 is a cross-sectional view of a semiconductor component at an early stage of manufacture in accordance with an embodiment of the present invention;

FIG. 2 is a cross-sectional view of the semiconductor component of FIG. 1 at a later stage of manufacture;

FIG. 3 is a cross-sectional view of the semiconductor component of FIG. 2 at a later stage of manufacture;

FIG. 4 is a cross-sectional view of the semiconductor component of FIG. 3 at a later stage of manufacture;

FIG. 17 is a cross-sectional view of the semiconductor component of FIG. 16 taken along section line 17-17 in accordance with an embodiment of the present invention;

FIG. 19 is a cross-sectional view of the semiconductor component of FIG. 18 taken along section line 19-19 in accordance with an embodiment of the present invention;

Figure 5:
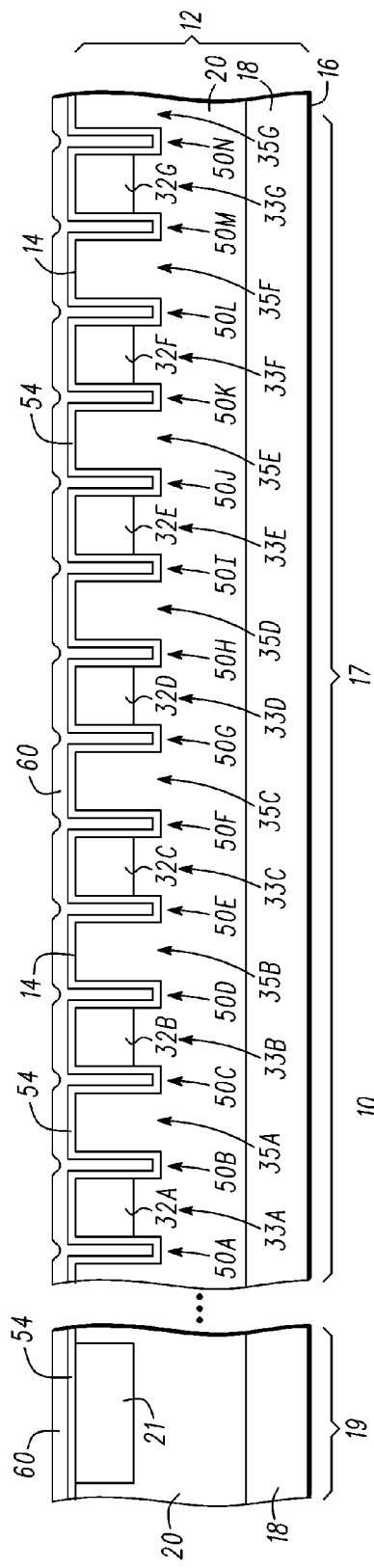
FIG. 5 is a cross-sectional view of the semiconductor component of FIG. 4 at a later stage of manufacture.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly, as described.

DETAILED DESCRIPTION

Generally the present invention provides a Schottky device and a method for manufacturing the Schottky device that includes manufacturing mesa structures or mesa regions having stepped or multi-concentration impurity profiles. In accordance with an aspect, the Schottky device comprises a semiconductor material of a first conductivity type comprising a plurality of trenches that extend into portions of the semiconductor material, wherein each trench of the plurality of trenches has sidewalls and a floor. A portion of the semiconductor material between two trenches serves as a mesa structure and has a multi-concentration impurity profile, wherein impurity materials of the multi-concentration impurity profile are of a second conductivity type. In alternative embodiments the impurity material may be formed in one or more sets of two adjacent trenches that are adjacent to each other or spaced apart by other trenches. In accordance with an embodiment, the first conductivity type is N-type conductivity and the second conductivity type is P-type conductivity. In accordance with another embodiment, the first conductivity type is P-type conductivity and the second conductivity type is N-type conductivity.

In accordance with another aspect, a Schottky device is provided that comprises a semiconductor material of a first conductivity type having first and second major surfaces. A plurality of trenches extend from the first major surface into the semiconductor material, wherein the plurality of trenches comprises at least first, second, and third trenches, wherein a first portion of the semiconductor material is between the first and second trenches, and a second portion of the semiconductor material is between the second and third trenches. The Schottky device includes conductivity modulation means that modulates conductivity in the first portion of the semiconductor material.

In accordance with another aspect, a method for manufacturing a Schottky device comprises providing a semiconductor material of a first conductivity type having first and second major surfaces and forming a first mesa structure from a first portion of the semiconductor material. A first doped region of a second conductivity type and a first impurity material concentration is formed in a first sub-portion of the first mesa structure, wherein the first doped region extends from the first major surface a first distance into the first mesa structure. A second doped region of the second conductivity type and a second impurity material concentration is formed in a second sub-portion of the first mesa structure and a Schottky contact is formed that contacts the first mesa structure.

FIG. 1 is a cross-sectional view of a portion of a semiconductor component 10 such as for example, a Schottky device, during manufacture in accordance with an embodiment of the present invention. What is shown in FIG. 1 is a semiconductor material 12 having opposing surfaces 14 and 16. Surface 14 is also referred to as a front or top surface and surface 16 is also referred to as a bottom or back surface. In accordance with this embodiment, semiconductor material 12 comprises an epitaxial layer 20 formed on a semiconductor substrate 18. Preferably, substrate 18 is silicon heavily doped with an N-type dopant or impurity material and epitaxial layer 20 is silicon lightly doped with an N-type dopant. In accordance with embodiments of the present invention, substrate 18 has a resistivity of less than about 6 milliOhm-centimeters (mΩ-cm) and epitaxial layer 20 has a thickness ranging about 8 micrometers (μm) to about 20 μm and a resistivity ranging from about 4 Ω-cm to about 12 Ω-cm. By way of example, substrate 18 has a resistivity of about 5.4 mΩ-cm, epitaxial layer 20 has a resistivity of about 5.9 Ω-cm and a thickness of about 13.5 μm. Substrate layer 18 provides a low resistance conduction path for current to flow in a Schottky device. It should be noted that a region or layer doped with an N-type dopant is said to be of an N-type conductivity or an N conductivity type and a region or layer doped with a P-type dopant is said to be of a P-type conductivity or a P conductivity type. Suitable N-type dopants include arsenic, antimony, phosphorus, or the like and suitable P-type dopants include boron, indium, or the like.

It should be appreciated that semiconductor material 12 includes an active region 17 and an edge termination region 19. An edge termination structure 21 may be formed in edge termination region 19. It should be noted that edge termination structure 21 has been included in block form for the sake of completeness and that additional processing steps may be performed to complete the formation of edge termination structure 21.

Still referring to FIG. 1, surface 14 is cleaned using, for example, a wet hydrofluoric (HF) acid etching process, then a layer of dielectric material 22 is formed on or from epitaxial layer 20. In accordance with an embodiment, the material of dielectric layer 22 is silicon dioxide having a thickness ranging from about 100 Angstroms (Ω) to about 5,000Ω. By way of example, dielectric layer 22 is silicon dioxide formed using a dry oxidation process or a steam oxidation process at a temperature ranging from about 750 degrees Celsius (° C.) to about 1,050° C. An exemplary temperature for forming dielectric layer is 900° C. Dielectric layer 22 may be formed by oxidation techniques, deposition techniques, etc. Other suitable materials for dielectric layer 22 include silicon nitride or the like.

A layer of photoresist is patterned over dielectric layer 22 to form a masking structure 24 having masking elements 26 and openings 28 that expose portions of dielectric layer 22. Masking structure 24 is also referred to as a mask, a screen mask, or an implant mask. Doped regions 32A, 32B, 32C, 32D, 32E, 32F, and 326 of, for example P-type conductivity may be formed in epitaxial layer 20 by implanting an impurity material such as boron or indium through openings 28, the exposed portions of dielectric layer 22, and into epitaxial layer 20. In accordance with embodiments in which the impurity material is boron, the boron may be implanted at a dose ranging from about $1 \times 10^{12}$ ions per centimeter squared (ions/cm²) to about $1 \times 10^{14}$ ions/cm² and an implant energy ranging from about 50 kilo electron volts (keV) to about 450 keV. By way of example, the implant dose is about $8 \times 10^{12}$ ions/cm² and the implant energy is about 300 keV. Masking structure 24 is removed. The implant may be activated and diffused using a Rapid Thermal Anneal (RTA) performed in, for example, a nitrogen ambient at a temperature ranging from about 850° C. to about 1,100° C. for a time ranging from 30 seconds to about 2 minutes. For the sake of clarity, doped regions 32A, 32B, 32C, 32D, 32E, 32F, and 326 may be referred to as doped regions 32A-32G. It should be noted the technique for forming doped regions 32A-326 is not limited to an implantation technique. Alternatively, doped regions 32A-32G may be formed by deposition and diffusion techniques.

Referring now to FIG. 2, a layer of photoresist is patterned over dielectric layer 22 to form a masking structure 36 having masking elements 38 and openings 40 that expose portions of dielectric layer 22. Masking structure 36 is also referred to as a mask or an etch mask.

Referring now to FIG. 3, trenches 50A, 50B, 50C, 50D, 50E, 50F, 50G, 50H, 50I, 50J, 50K, 50L, 50M, and 50N are formed in epitaxial layer 20 by removing portions of dielectric layer 22 and portions of epitaxial layer 20 exposed by the removal of the portions of dielectric layer 22. For the sake of clarity, trenches 50A, 50B, 50C. 50D, 50E, 50F, 50G, 50H, 50I, 50J, 50K, 50L, 50M, and 50N may be referred to as trenches 50A-50N. More particularly, the exposed portions of dielectric layer 22 and the portions of epitaxial layer 20 that are below the exposed portions of dielectric layer 22 are removed. Dielectric layer 22 that has removed portions, i.e., the remaining portions of dielectric layer 22 may be referred to as a hardmask. Trench 50A has sidewalls $50A_S$ and a floor $50A_F$, trench 50B has sidewalls $50B_S$ and a floor $50B_F$, trench 50C has sidewalls $50C_S$ and a floor $50C_F$, trench 50D has sidewalls $50D_S$ and a floor $50D_F$, trench 50E has sidewalls $50E_S$ and a floor $50E_F$, trench 50F has sidewalls $50F_S$ and a floor $50F_F$, trench 50G has sidewalls $50G_S$ and a floor $50G_F$, trench 50H has sidewalls $50H_S$ and a floor $50H_F$, trench 50I has sidewalls $50I_S$ and a floor $50I_F$, trench 50J has sidewalls $50J_S$ and a floor $50J_F$, trench 50K has sidewalls $50K_S$ and a floor $50K_F$, trench 50L has sidewalls $50L_S$ and a floor $50L_F$, trench 50M has sidewalls $50M_S$ and a floor $50M_F$, and trench 50N has sidewalls $50N_S$ and a floor $50N_F$. By way of example, trenches 50A-50N may be formed using Reactive Ion Etching (RIE) etching with a fluorine and oxygen based chemistry, wherein the fluorine to oxygen ratio may be used to control the trench profile parameters such as the anisotropy of the trenches and the uniformity of the trench depth. Trenches 50A-50N may be etched to have a depth, D, ranging from about 0.7 µm to about 5 µm, a trench width, W, ranging from about 0.2 µm to about 3 µm, and a center-to-center spacing, S, ranging from about 0.75 µm to about 5 µm. By way of example, the trenches 50A-50N have a depth, D, of about 2.2 µm, a width, W, of about 0.8 µm, a center-to-center spacing, S, of about 2.5 µm.

Although trenches with vertical sidewalls are preferred, this is not a limitation of the present invention. Alternatively trenches 50A-50N may have tapered profiles where the widths of trenches 50A-50N at their trench floors may be less than their widths near surface 14. In embodiments in which the trench sidewalls are substantially vertical and the trench floors are substantially parallel to surface 14, the sidewalls serve as vertical surfaces and the floors serve as horizontal surfaces. Trenches 50A-50N are shown as ending in epitaxial layer 20, however, this is not a limitation of the present invention. For example, trenches 50A-50N may end at substrate 18 or they may extend into substrate 18. In addition, the depths of trenches 50A-50N may be selected so that doped regions 32A, 32B, 32C, 32D, 32E, 32F, and 32G extend a distance into epitaxial layer 20 from surface 14 that is at least 40 percent (%) of the trench depth. The etching technique and the number of trenches 50A-50N formed in epitaxial layer 20 are not limitations of the present invention.

Formation of trenches 50A-50N, leaves mesa structures 33A, 33B, 33C, 33D, 33E, 33F, 33G, 35A, 35B, 35C, 35D, 35E, and 35F that are formed from portions of semiconductor material 12. For the sake of clarity, mesa structures 33A, 33B, 33C, 33D, 33E, 33F, and 33G may be referred to as mesa structures 33A-33G and mesa structures 35A, 35B, 35C, 35D, 35E, and 35F may be referred to as mesa structures 35A-35F. Mesa structure 33A is between and laterally bounded by trenches 50A and 50B; mesa structure 33B is between and laterally bounded by trenches 50C and 50D; mesa structure 33C is between and laterally bounded by trenches 50E and 50F; mesa structure 33D is between and laterally bounded by trenches 50G and 50H; mesa structure 33E is between and laterally bounded by trenches 50I and 50J; mesa structure 33F is between and laterally bounded by trenches 50K and 50L, mesa structure 33G is between and laterally bounded by trenches 50M and 50N. Mesa structure 35A is between and laterally bounded by trenches 50B and 50C; mesa structure 35B is between an laterally bounded by trenches 50D and 50E mesa structure 35C is between and laterally bounded by trenches 50F and 50G; mesa structure 35D is between and laterally bounded by trenches 50H and 50I; mesa structure 35E is between and laterally bounded by trenches 50J and 50K; and mesa structure 35F is between and laterally bounded by trenches 50L and 50M.

It should be noted that doped region 32A is in mesa structure 33A, doped region 32B is in mesa structure 33B, doped region 32C is in mesa structure 33C, doped region 32D is in mesa structure 33D, doped region 32E is in mesa structure 33E, doped region 32F is in mesa structure 33F, and doped region 32G is in mesa structure 33G.

Referring now to FIG. 4, the remaining portions of dielectric layer 22 are removed to expose surface 14, sidewalls $50A_S$-$50N_S$, and floors $50A_F$-$50N_F$, which are then cleaned using a wet HF etching technique to remove any native oxide that may be present. A dielectric layer 54 is formed on the sidewalls surface 14, $50A_S$-$50N_S$, and floors $50A_F$-$50N_F$. By way of example, dielectric layer 54 is formed by a wet oxidation technique at a temperature ranging from about 1,000° C. to about 1,400° C. and has a thickness ranging from about 1,000 Å to about 5,000 Å.

Referring now to FIG. 5, a layer of semiconductor material 60 is formed on the dielectric layer 54. In accordance with an embodiment, the material of semiconductor layer 60 is polysilicon doped with an N-type impurity material having a dopant concentration ranging from about $1 \times 10^{18}$ atoms/cm$^3$ to about $1 \times 10^{20}$ atoms/cm$^3$. By way of example, semiconductor layer 60 is doped with phosphorus having a dopant concentration of about $1 \times 10^{19}$ atoms/cm$^3$. It should be noted that the dopant or impurity material concentration of polysilicon layer 60 is not a limitation of the present invention.

Figure 6:
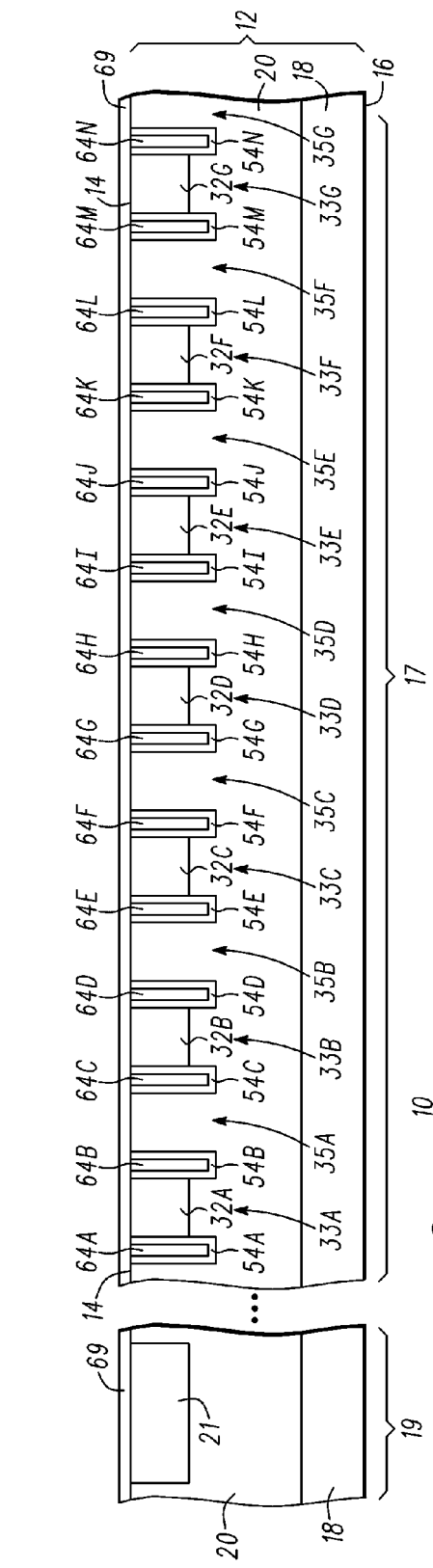
FIG. 6 is a cross-sectional view of the semiconductor component of FIG. 5 at a later stage of manufacture.

Referring now to FIG. 6, polysilicon layer 60 and dielectric layer 54 are etched back using, for example, a plasma ion etcher with a fluorine chemistry. Etching dielectric layer 54 leaves a dielectric layer 54A on sidewalls $50A_S$ and floor $50A_F$ a dielectric layer 54B is formed on sidewalls $50B_S$ and floor $50B_F$; a dielectric layer 54C is formed on sidewalls $50C_S$ and floor $50C_F$; a dielectric layer 54D is formed on sidewalls $50D_S$ and floor $50D_F$; a dielectric layer 54E is formed on sidewalk $50E_S$ and floor $50E_F$; a dielectric layer 54F is formed on sidewalls $50F_S$ and floor $50F_F$; a dielectric layer 54G is formed on sidewalk $50G_S$ and floor $50G_F$; a dielectric layer 54H is formed on sidewalls $50H_S$ and floor $50H_F$; a dielectric layer 54I is formed on sidewalls $50I_S$ and floor $50I_F$; a dielectric layer 54J is formed on sidewalls $50J_S$ and floor $50J_F$; a dielectric layer 54K is formed on sidewalls $50K_S$ and floor $50K_F$; a dielectric layer 54L is formed on sidewalls $50L_S$ and floor $50L_F$, a dielectric layer 54M is formed on sidewalls $50M_S$ and floor $50M_F$, and a dielectric layer 54N is formed on sidewalls $50N_S$ and floor $50N_F$. For the sake of clarity, dielectric layers 54A, 54B, 54C, 54D, 54E, 54F, 54G, 54H, 54I, 54J, 54K, 54L, 54M, and 54N may be referred to as dielectric layers 54A-54N.

Etching back polysilicon layer 60 leaves portions 64A, 64B, 64C, 64D, 64E, 64F, 64G, 64H, 64I, 64J, 64K, 64L, 64M, and 64N on dielectric layers 54A-54N in trenches 50A-50N, respectively. Portions 64A, 64B, 64C, 64D, 64E, 64F, 64G, 64H, 64I, 64J, 64K, 64L, 64M, and 64N may be referred to as polysilicon fill material, polysilicon plugs, or the like. It should be noted that polysilicon remaining in trenches 50A-50N may partially fill trenches 50A-50N or fully fill trenches 50A-50N. It should be further noted that an optional planarization step may be performed to planarize the surface 14 and the exposed portions of polysilicon fill material 64A-64N and the exposed portions of dielectric layers 54A-54N. By way of example, the optional planarization step includes the use of an ion plasma tool with fluorine, chlorine, and oxygen chemistries. A layer of dielectric material 69 having a thickness ranging from about 1,000 Å to about 4,000 Å is formed on the exposed portions of surface 14 of epitaxial layer 20, the exposed portions of mesa structures 33A-33G, the exposed portions of mesa structures 35A-35F, the exposed portions of polysilicon fill material 64A-64N, and the exposed portions of dielectric layers 54A-54N. Dielectric layer 69 may be an oxide grown using a dry oxidation process or a steam oxidation process. In accordance with embodiments in which dielectric layer 69 is oxide, it may be referred to as screen oxide.

Figure 7:
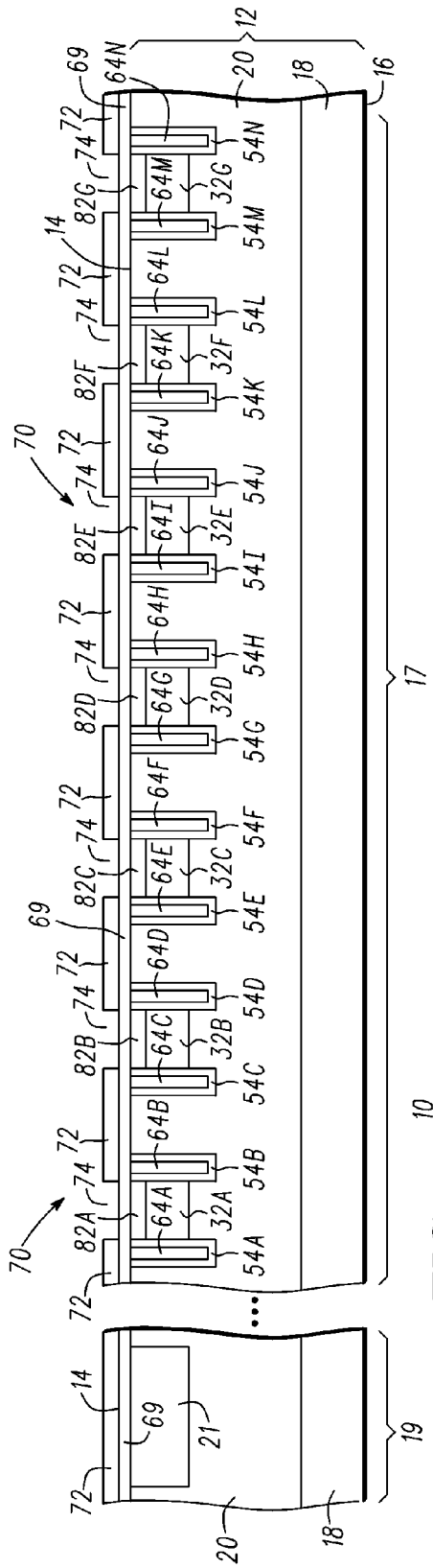
FIG. 7 is a cross-sectional view of the semiconductor component of FIG. 6 at a later stage of manufacture.

Referring now to FIG. 7, a layer of photoresist is patterned over screen oxide layer 69 to form a masking structure 70 having masking elements 72 and openings 74 that expose the portions of screen oxide layer 69 over doped regions 32A-32G in mesa structures 33A-33G, respectively. Masking structure 70 is also referred to as a mask, a screen mask, or an implant protect mask. Doped regions 32A-32G may be doped with an impurity material of P-type conductivity by, for example, implanting an impurity material such as boron through openings 74 to form enhanced doped regions 82A, 82B, 82C, 82D, 82E, 82F, and 82G in portions of doped regions 32A, 32B, 32C, 32D, 32E, 32F, and 32G, respectively. Boron may be implanted at a dose ranging from about $1 \times 10^{12}$ ions per centimeter squared (ions/cm$^2$) to about $1 \times 10^{14}$ ions/cm$^2$, an implant energy ranging from about 50 kilo electron volts (keV) to about 300 keV, and an implant angle ranging from about 0 degrees to about 45 degrees. By way of example, the implant dose is about $1.5 \times 10^{13}$ ions/cm$^2$, the implant energy is about 100 keV, and the implant angle is about 7 degrees. For the sake of clarity, enhanced doped regions 82A, 82B, 82C, 82D, 82E, 82F, and 82G may be referred to as enhanced doped regions 82A-82G. Thus, in accordance with an embodiment, doped regions 32A-32G are formed in mesa structures mesa structures 33A-33G, respectively, and doped regions 82A-82G are formed within doped regions 32A-32G and mesa structures 33A-33G, respectively, for example, doped regions 32A-32G are formed within sub-portions of mesa structures 33A-33G and doped regions 82A-82G are formed within sub-portions of mesa structures 33A-33G. Doped regions 32A-32G extend from surface 14 into semiconductor material 12 a distance that is greater than the distance that doped regions 82A-82G extend into semiconductor material 12, i.e., doped regions 82A-82G extend from surface 14 into semiconductor material 12 a distance that is less than the distance that doped regions 32A-32G extend into semiconductor material 12. Thus, doped regions 32A-32G and 82A-82G are formed in mesa structures 33A-33G, respectively, such that mesa structures 33A-33G have multi-concentration impurity profiles. The multi-concentration impurity profiles may be referred to as a multi-concentration impurity material profiles. In an embodiment, doped regions 82A-82G are formed within the sub-portions of mesa structures 33A-33G in which doped regions 32A-32G are formed, respectively. In accordance with another embodiment, the multi-concentration impurity profiles are stepped dopant profiles. It should be noted that some of doped regions 32A-32G can be formed using, for example an implant technique and other doped regions of doped regions 32A-32G can be formed using a diffusion technique. Likewise, some of doped regions 82A-82G can be formed using, for example an implant technique and other doped regions of doped regions 82A-82G can be formed using a diffusion technique. Alternatively, the dopant concentrations of doped regions 32A-32G may be the same or different from one another and the dopant concentrations of doped regions 82A-82G may be the same or different from one another.

Masking structure 70 is removed and the implant may be activated and diffused using an RTA step performed in, for example, a nitrogen ambient at a temperature ranging from about 850° C. to about 1,100° C. for a time ranging from 30 seconds to about 2 minutes. In accordance with an embodiment, the anneal temperature may be about 1,000° C. and the anneal time may be about 45 seconds. The technique for forming doped regions 82A-82G is not limited to an implantation technique. Alternatively, doped regions 82A-82G may be formed by deposition and diffusion techniques. Although enhanced doped regions are described as being formed after the formation of trenches 50A-50N, this is not a limitation of the present invention. For example, enhanced doped regions 82A-82G may be formed before the formation of trenches 50A-50N or before or after formation of doped regions 32A-32G.

Figure 8:
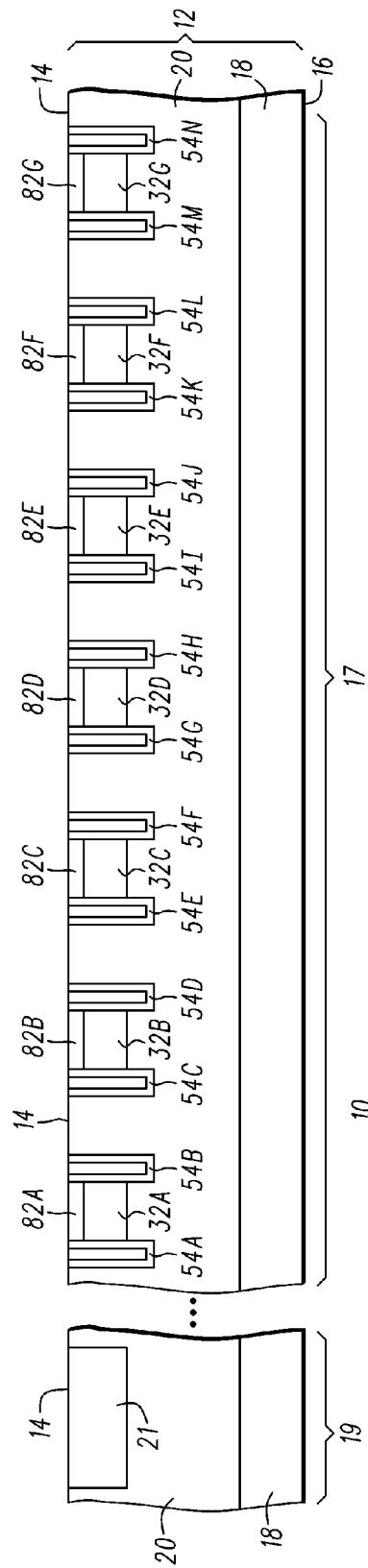
FIG. 8 is a cross-sectional view of the semiconductor component of FIG. 7 at a later stage of manufacture.

Referring now to FIG. 8, screen oxide layer 69 is removed to expose surface 14 and the exposed portions of polysilicon fill material 64A-64N, and the exposed portions of dielectric layers 54A-54N, which are cleaned using a wet HF etching technique to remove any native oxide that may be present.

Figure 9:
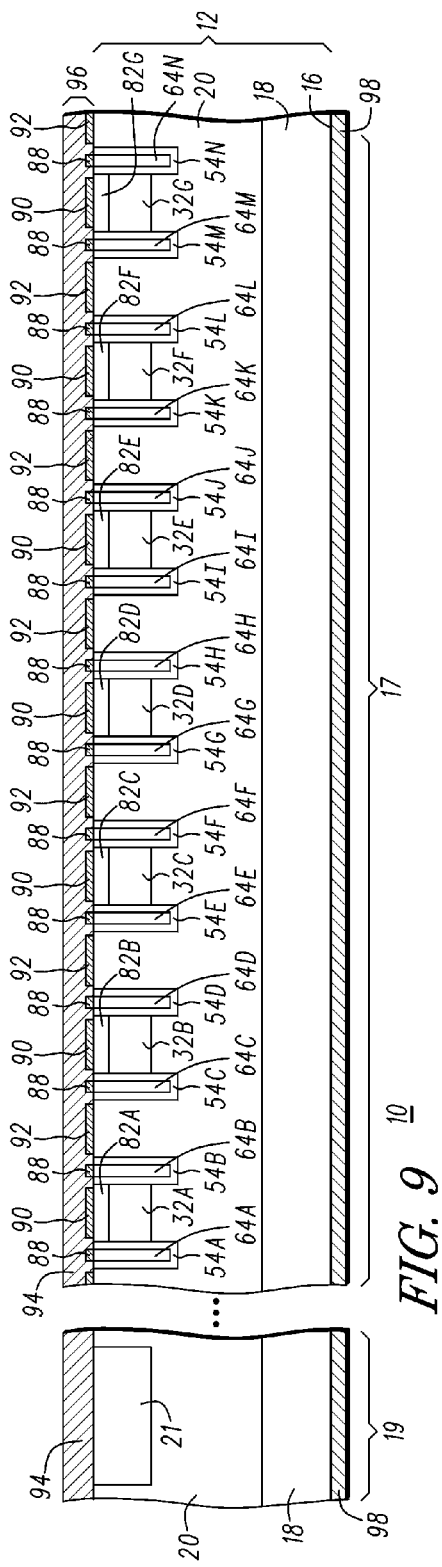
FIG. 9 is a cross-sectional view of the semiconductor component of FIG. 8 at a later stage of manufacture.

Referring now to FIG. 9, a barrier metal deposition process is performed in which a barrier metal is deposited on dielectric layers 54A-54N, polysilicon fill material 64A-64N, enhanced doped regions 82A-82G, and portions of surface 14. In accordance with an embodiment, the barrier metal includes a nickel platinum metal alloy having a thickness ranging from about 100 Å to about 2,000 Å. By way of example, the nickel platinum metal alloy has a thickness of about 700 Å. The nickel platinum metal alloy is treated to a rapid thermal anneal in a nitrogen ambient at a temperature ranging from about 300° C. to about 700° C. for a time ranging from about 15 seconds to about 120 seconds. The heat treatment causes the nickel platinum metal alloy to react with the silicon to form nickel platinum silicide in all regions in which the nickel platinum metal alloy is in contact with silicon or polysilicon. Thus, nickel platinum silicide layers 88 are formed from polysilicon fill material 50A-50N, nickel platinum silicide layers 90 are formed from doped regions 82A-82G, and nickel platinum silicide layers 92 are formed from the exposed portions of surface H. The unreacted nickel platinum metal alloy is removed using for example a hot SPM strip. The hot SPM strip solution may be comprised of sulfuric acid and hydrogen peroxide. It should be noted that the barrier metal is not limited to nickel platinum alloys. Other suitable materials for the barrier metal layers include titanium nitride, titanium, tungsten, platinum, aluminum copper, or the like. In addition, the number of metal layers forming the barrier metal is not limited to a single metal layer, but may be comprised of one, two, three, or more metal layers.

A metal layer 94 is formed in contact with the barrier metal layer or layers. Suitable materials for metal layer 94 include aluminum, nickel, silver, or the like. Silicide layers 88, 90, and 92, the barrier metal layers, and metal layer 94 form an anode or anode contact 96 of Schottky device 10 and also may be referred to as a Schottky metallization system or a Schottky contact. Thus, a Schottky contact is formed to at least one of mesa structures 33A-33G. A conductor 98 is formed in contact with surface 16 and serves as a cathode or cathode contact for Schottky device 10 and may be referred to as a cathode metallization system. Suitable metallization systems for conductor 98 include a gold alloy, titanium-nickel-gold, titanium-nickel-silver, or the like. It should be noted that the metal of the portions of the metallization system in contact with mesa structures that include multi-concentration dopant profiles, i.e., mesa structures 33A-33G may be different than the metal of the portions of the metallization system that contact mesa structures in which the multi-concentration dopant profiles are absent, e.g., mesa structures 35A-35F. Thus, silicide layers 88 in combination with portions of metal layer 94 form ohmic contact portions to the electrically conductive material 64A-64N in trenches 50A-50N, respectively, where electrically conductive material 64A-64N may be polysilicon fill material; silicide layers 90 in combination with portions of metal layer 94 form contacts to sets of doped regions 32A/82A to 32G/82G that are between an ohmic contact and conventional Schottky contacts; and silicide layers 92 in combination with portions of metal layer 94 form conventional Schottky contacts to mesa structures 35A-35G. It should be noted that a contact formed by a barrier metal such as metal 92 and a lightly doped epitaxial layer, e.g., a dopant concentration of about $10^{15}$ cm$^3$, forms a conventional Schottky contact and a contact formed by a metal such as metal 88 and a highly doped semiconductor material, e.g., a dopant concentration of about $10^{19}$ cm$^3$, such as N-type semiconductor material 64 forms a conventional Ohmic contact.

Figure 10:
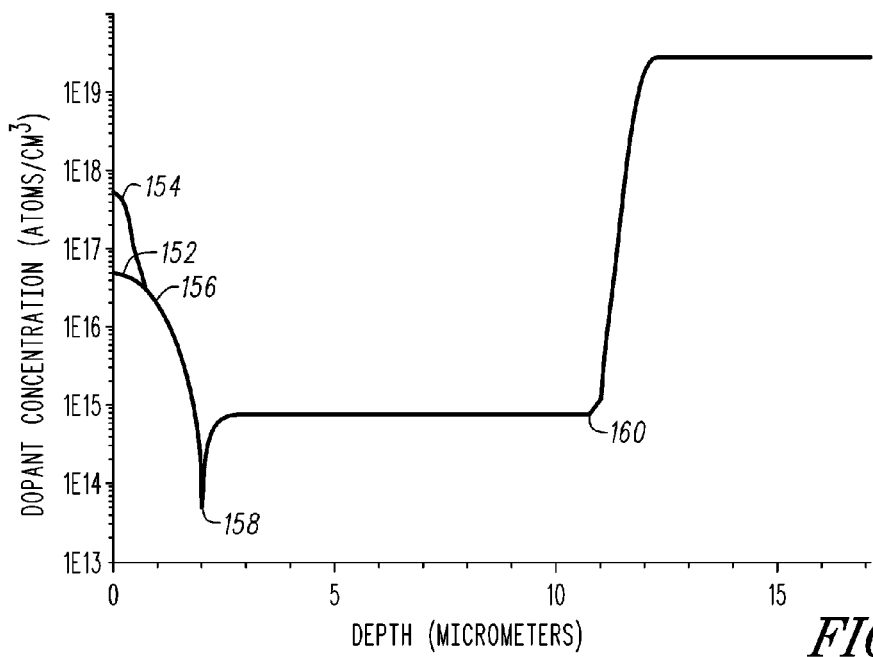
FIG. 10 is an impurity profile in accordance with and embodiment of the present invention.

FIG. 10 illustrates dopant profiles of impurity material in regions of semiconductor material 12 between adjacent trenches. More particularly, the dopant profiles are an example of an embodiment of the dopant concentration in doped regions such as doped regions 32A-32G and 82A-82G versus dopant depth or distance from surface 14 into semiconductor material 12. In accordance with embodiments of the present invention, the concentration of P-type impurity materials, i.e., the dopant concentration, at or near surface 14 has been increased such that a surface concentration of the P-type impurity materials or P-type dopants is about 5.5×10$^{17}$ atoms/cm$^3$. It should be noted that surface 14 is indicated as being at a depth of zero micrometers. For the sake of illustration, reference character 152 illustrates the surface concentration of P-type impurity materials after formation of doped regions 32A-32G. Reference character 154 illustrates the surface concentration of P-type impurity materials after the formation of enhanced doped regions 82A-82G. Reference character 156 illustrates the concentration of P-type impurity material at the depth at which enhanced doped regions 82A-82G end and reference character 158 illustrates the depth at which doped regions 32A-32G end, i.e., the P-N junction formed between doped regions 32A-32G and semiconductor material 12. The impurity material concentration between the depths indicated by reference characters 158 and 160 represent the impurity material concentration of epitaxial layer 20 and the impurity material concentration indicated by the depths to the right of reference character 160 indicate the impurity material concentration of semiconductor substrate 18. It should be noted that the impurity material concentrations of epitaxial layer 20 is substantially constant and the impurity material concentration of semiconductor substrate 18 is substantially constant, wherein the impurity material concentration of substrate 18 is greater than that of epitaxial layer 20.

Figure 11:
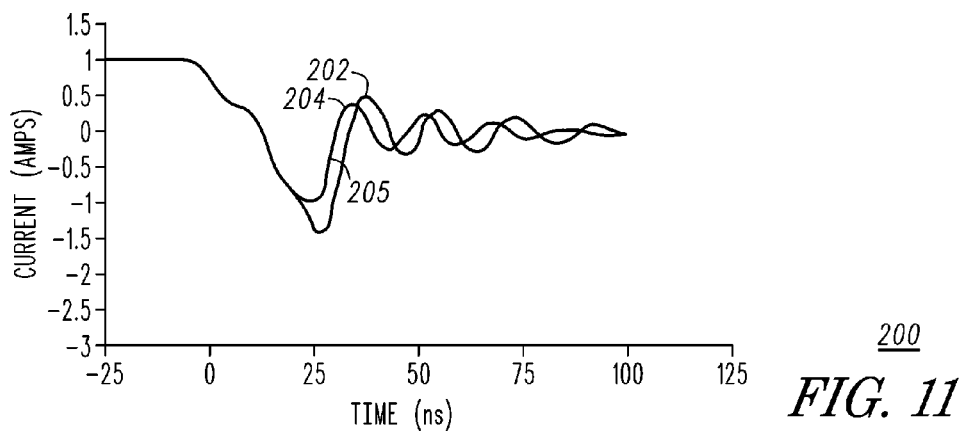
FIG. 11 is a plot of current versus time for a semiconductor component configured in accordance with an embodiment of the present invention.

FIG. 11 is a switching performance plot 200 illustrating the switching current versus time for Schottky devices in accordance with embodiments of the present invention. What is shown in FIG. 11 is the switching characteristics of a Schottky device that is switched off to a reverse voltage, VR, of 30 volts, a forward current, IF, of 1 Amp, and current change, di/dt, of 100 Amps per microsecond. Trace 202 indicates the switching performance of a typical Schottky device. It should be noted that the current decreases to about −1.5 Amps at about 26 nanoseconds. Traces 204 and 205 indicate that the current decreases to about −1 Amp at about 25 nanoseconds. From these plots it can be determined that increasing the concentration of impurity material in the mesa structures improves the forward voltage drop, VF, of a Schottky device, while leaving the reverse recovery charge substantially unaffected. Those skilled in the art would not expect that increasing the concentration of impurity material in the mesa structures would reduce the forward voltage VF of the Schottky device at a cost of increasing the switching speed. However, traces 204 and 205 demonstrate that the reduction in the forward voltage VF by increasing the concentration of the impurity material in accordance with embodiments of the present invention produces the unexpected result of insignificantly affecting the switching speed. It should be noted that trace 205 may substantially overlap trench 204 such that they appear as a single trace.

Figure 12:
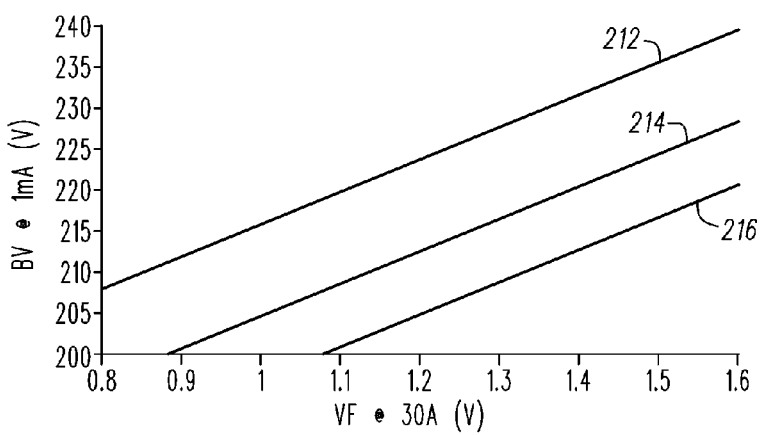
FIG. 12 is a plot of breakdown voltage versus forward voltage for a semiconductor configured in accordance with an embodiment of the present invention.

FIG. 12 is a plot 210 of breakdown voltage versus the forward voltage for Schottky devices manufactured in accordance with embodiments of the present invention. Trace 212 illustrates the breakdown voltage versus the forward voltage for Schottky devices manufactured in accordance with embodiments of the present invention. Trace 214 indicates the breakdown voltage versus the forward voltage for Schottky devices in which the mesa structures have received a single doping with impurity materials. Trace 216 illustrates the breakdown voltage versus the forward voltage for prior art Schottky devices. Plot 210 illustrates that the breakdown voltage of a Schottky device at a particular forward voltage is greater for Schottky devices manufactured in accordance with embodiments of the present invention.

Figure 13:
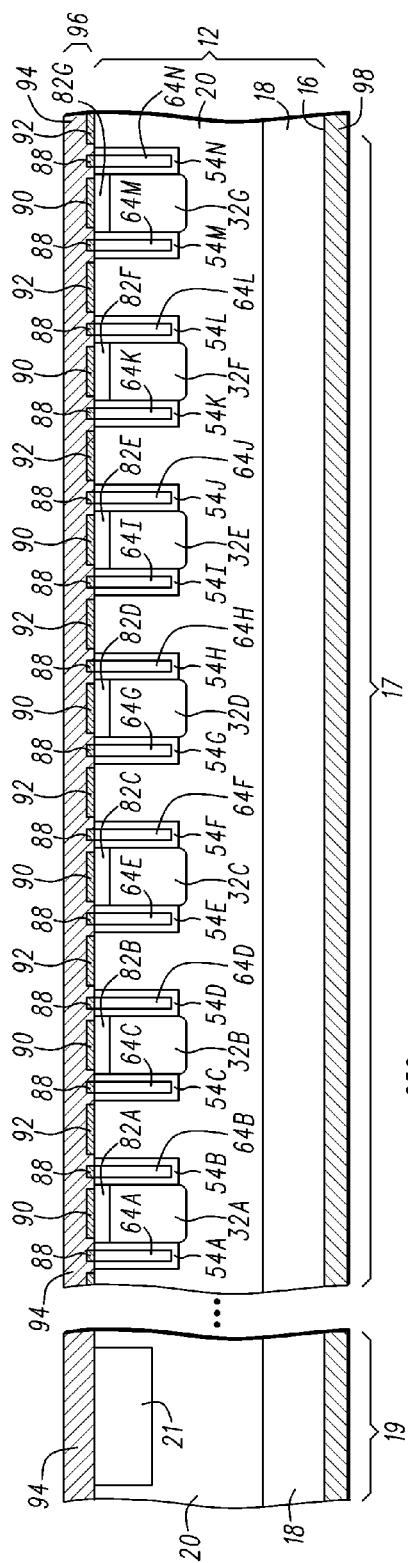
FIG. 13 is a cross-sectional view of a semiconductor component during manufacture in accordance with another embodiment of the present invention.

FIG. 13 is a cross-sectional view of a semiconductor component 250 in accordance with another embodiment of the present invention. What is shown in FIG. 13 is an embodiment in which doped regions 32A-32G extend further into epitaxial layer 20 than trenches 50A-50N extend into epitaxial layer 20.

Figure 14:
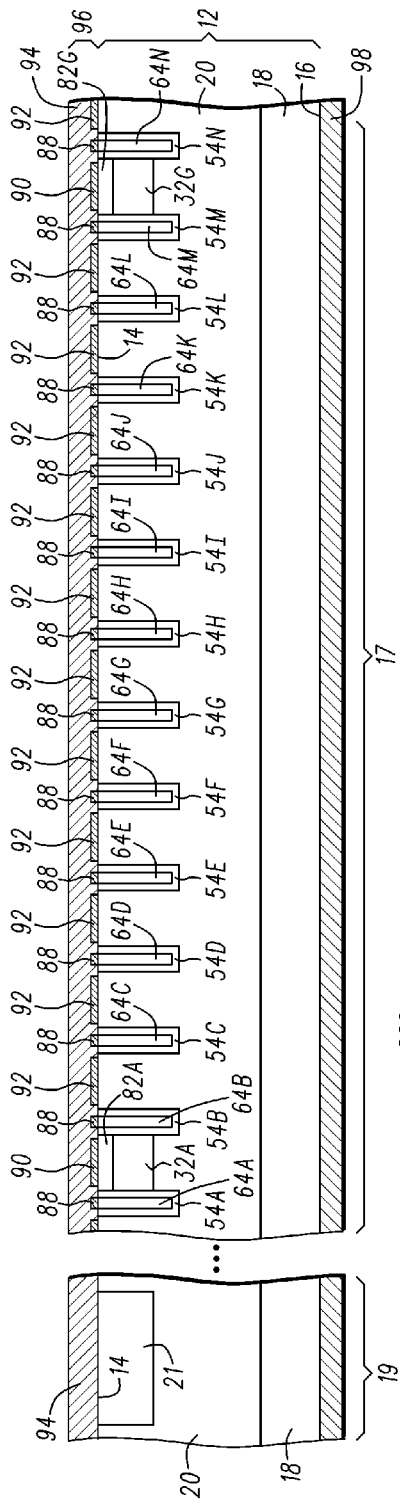
FIG. 14 is a cross-sectional view of a semiconductor component during manufacture in accordance with another embodiment of the present invention.

FIG. 14 is a cross-sectional view of a semiconductor component 260 in accordance with another embodiment of the present invention. What is shown in FIG. 14 is an embodiment in which a frequency of the occurrence of doped regions formed between trenches is decreased. More particularly, FIG. 14 illustrates the formation of doped regions 32A and 32G and enhanced doped regions 82A and 82F. Forming enhanced doped regions in selected mesa regions allows injection of minority carriers at a sufficiently high forward voltage and modulation of the conductivity of doped regions 32A-32G, thereby reducing the on-resistance of epitaxial layer 20 and providing a low forward voltage in the forward operating mode. The amount of conductivity modulation may be controlled by controlling the concentration of the enhanced doped regions and the number of mesa regions in which enhanced doped regions are formed, wherein using a higher concentration, a higher number of mesa regions having the enhanced doped regions, or using both a higher concentration and a higher number of mesa regions having the enhanced doped regions allows a higher conductivity modulation.

Figure 15:
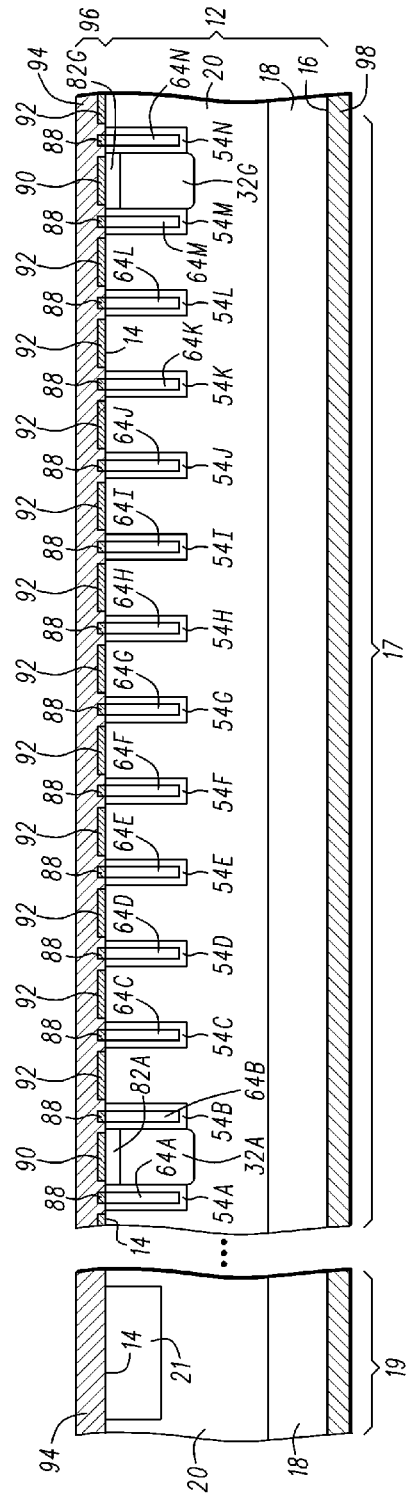
FIG. 15 is a cross-sectional view of a semiconductor component during manufacture in accordance with another embodiment of the present invention.

FIG. 15 is a cross-sectional view of a semiconductor component 270 in accordance with another embodiment of the present invention. What is shown in FIG. 15 is an embodiment in which a frequency of the occurrence of doped regions formed between trenches is decreased. More particularly, FIG. 15 illustrates the formation of doped regions 32A and 32G and enhanced regions 82A and 82G in which doped regions 32A and 32G extend further into epitaxial layer 20 than trenches 50A, 50B, 50M, and 50N extend into epitaxial layer 20.

Figure 16:
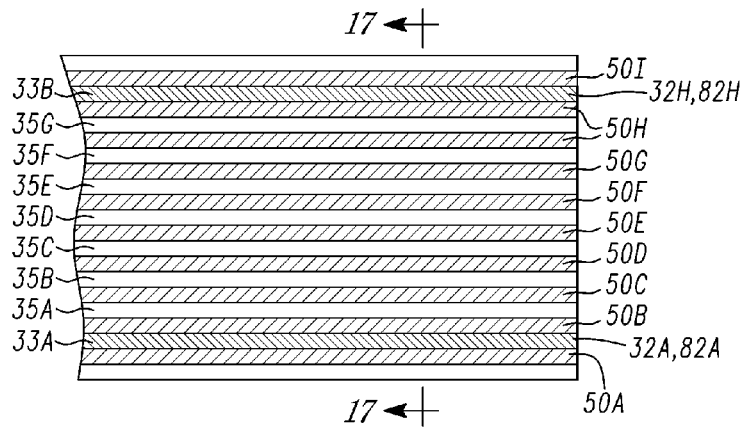
FIG. 16 is a layout of a semiconductor component manufactured in accordance with another embodiment of the present invention.

FIG. 16 is a layout of a semiconductor component 280 manufactured in accordance with another embodiment of the present invention. Semiconductor component 280 is comprised of a plurality of trenches 50 and mesa structures 33, where a mesa structure 33 is formed between adjacent trenches 50, and where a multi-concentration doping profile is included in every seventh mesa structure 33. FIG. 17 is a cross-sectional view along section line 17-17 of FIG. 16 illustrating the formation of a multi-concentration doping profile in mesa structures 33A and 33H. It should be noted that the number and spacing of the multi-concentration doped regions is not a limitation of the present invention. For example, the multi-concentration profiles may be formed in every other mesa structure, every third mesa structure, every fourth mesa structure, every fifth mesa structure, every sixth mesa structure, every eighth mesa structure, etc. That is the multi-concentration doped regions may be formed in every nth mesa structure, where "n" is an integer. Alternatively, multi-concentration doped regions may be formed in "n" adjacent mesa structure and absent in one or more mesa structures adjacent the "n" adjacent mesa structures; or multi-concentration doped regions may be formed in "n" adjacent mesa structures, absent in one or more mesa structures adjacent the "n" adjacent mesa structures and formed another "n" adjacent mesa structures, i.e., the one or more adjacent mesa structures without multi-concentration doped regions may be between two sets of "n" adjacent mesa structures having multi-concentration doped regions.

Figure 18:
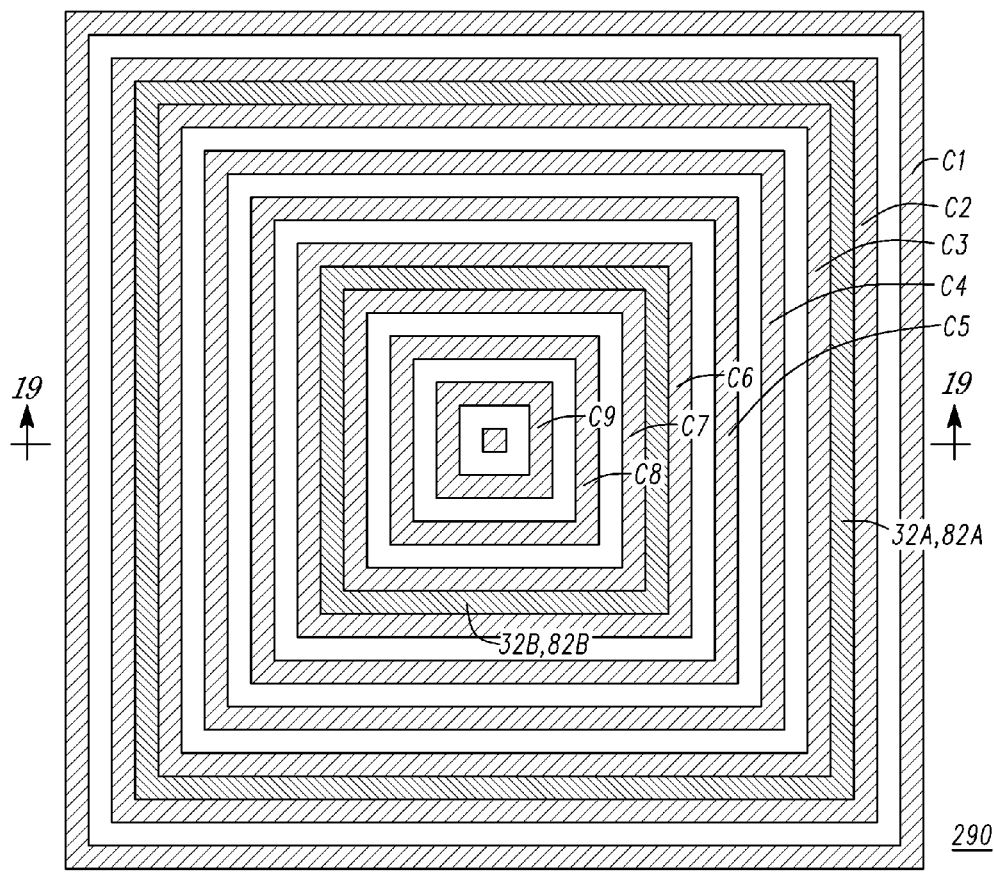
FIG. 18 is a layout of a semiconductor component manufactured in accordance with another embodiment of the present invention.

FIG. 18 is a layout of a semiconductor component 290 manufactured in accordance with another embodiment of the present invention. Semiconductor component 290 is comprised of a plurality of concentric square-shaped Schottky diode cells or rings C1, C2, C3, C4, C5, C6, C7, C8, and C9, where concentric trenches are formed in the regions identified by reference characters C1-C9. In accordance with the embodiment shown in FIG. 18, multi-concentration doped regions 32A and 82A are formed in the mesa structures between regions C2 and C3 and multi-concentration doped regions 32B and 82B are formed in the mesa structures between regions C6 and C7. It should be noted that the number and spacing of the multi-concentration doped regions is not a limitation of the present invention. For example, the multi-concentration profiles may be formed in the mesa structures between every other concentric trench, every third concentric trench, every fourth concentric trench, every fifth concentric trench, every sixth concentric trench, every eighth concentric trench, etc. That is the multi-concentration doped regions may be formed in every nth concentric trench, where "n" is an integer. FIG. 19 is a cross-sectional view along section line 19-19 of FIG. 18 illustrating the formation of a multi-concentration doping profile in mesa structures 32A and 32H.

For the purpose of illustration and not to limit the scope of the claims, a concentric trench 51A having a floor and sidewalls is formed in a portion C1 of semiconductor material 12; a concentric trench 51B having a floor and sidewalls is formed in a portion C2 of semiconductor material 12; a concentric trench 51C having a floor and sidewalls is formed in a portion C3 of semiconductor material 12; a concentric trench 51D having a floor and sidewalls is formed in a portion C4 of semiconductor material 12; a concentric trench 51E having a floor and sidewalls is formed in a portion C5 of semiconductor material 12; a concentric trench 51F having a floor and sidewalls is formed in a portion C6 of semiconductor material 12; a concentric trench 51G having a floor and sidewalls is formed in a portion C7 of semiconductor material 12; a concentric trench 51H having a floor and sidewalls is formed in a portion C8 of semiconductor material 12; and a concentric trench 51I having a floor and sidewalls is formed in a portion C9 of semiconductor material 12. Trenches 51A-51I are referred to as concentric trenches because concentric trench 51I is surrounded by concentric trench 51H, concentric trench 51H is surrounded by concentric trench 51G, concentric trench 51G is surrounded by concentric trench 51F, concentric trench 51F is surrounded by concentric trench 51E, concentric trench 51E is surrounded by concentric trench 51D, concentric trench 51D is surrounded by concentric trench 51C, concentric trench 51C is surrounded by concentric trench 51B, and concentric trench 51B is surrounded by concentric trench 51A.

A dielectric layer 54A is formed on the floor and sidewalls of concentric trench 51A and an electrically conductive material 64A is formed on dielectric layer 54A; a dielectric layer 54B is formed on the floor and sidewalls of concentric trench 51B and an electrically conductive material 64B is formed on dielectric layer 54B; a dielectric layer 54C is formed on the floor and sidewalls of concentric trench 51C and an electrically conductive material 64C is formed on dielectric layer 54C; a dielectric layer 54D is formed on the floor and sidewalls of concentric trench 51D and an electrically conductive material 64D is formed on dielectric layer 54D; a dielectric layer 54E is formed on the floor and sidewalls of concentric trench 51E and an electrically conductive material 64E is formed on dielectric layer 54E; a dielectric layer 54F is formed on the floor and sidewalls of concentric trench 51F and an electrically conductive material 64F is formed on dielectric layer 5FC; a dielectric layer 54G is formed on the floor and sidewalls of concentric trench 51G and an electrically conductive material 64G is formed on dielectric layer 54G; a dielectric layer 54H is formed on the floor and sidewalls of concentric trench 51H and an electrically conductive material 64H is formed on dielectric layer 54H; and a dielectric layer 54I is formed on the floor and sidewalls of concentric trench 51I and an electrically conductive material 64I is formed on dielectric layer 54I.

A concentric Schottky contact region 39A is formed from the portion of semiconductor material 12 between concentric trenches 51A and 51B; a concentric Schottky contact region 39B is formed from the portion of semiconductor material 12 between concentric trenches 51C and 51D; a concentric Schottky contact region 39C is formed from the portion of semiconductor material 12 between concentric trenches 51D and 51E; a concentric Schottky contact region 39D is formed from the portion of semiconductor material 12 between concentric trenches 51E and 51F; a concentric Schottky contact region 39E is formed from the portion of semiconductor material 12 between concentric trenches 51G and 51H; a concentric Schottky contact region 39F is formed from the portion of semiconductor material 12 between concentric trenches 51H and 51I; and a Schottky contact region 39G is formed from the portion of semiconductor material 12 within concentric trench 51I.

Schottky contact portions of contact 94 are formed in contact with Schottky contact regions 39A, 39B, 39C, 39D, 39E, 39F, and 39G. It should be noted that Schottky contact portions may be referred to as conventional Schottky contacts and are not limited to being concentric shaped contacts.

A multi-concentration contact region 37A is formed from the portion of semiconductor material 12 between concentric trenches 51B and 51C and a multi-concentration contact region 37B is formed between concentric trenches 51F and 51G. A multi-concentration contact portion of contact 94 is formed in contact with multi-concentration contact region 37A and a multi-concentration contact portion of contact 94 is formed in contact with multi-concentration contact region 37B.

An Ohmic contact portion of contact 94 is formed in contact with electrically conductive material 64A, an Ohmic contact portion of contact 94 is formed in contact with electrically conductive material 64B, an Ohmic contact portion of contact 94 is formed in contact with electrically conductive material 64C, an Ohmic contact portion of contact 94 is formed in contact with electrically conductive material 64D, an Ohmic contact portion of contact 94 is formed in contact with electrically conductive material 64E, an Ohmic contact portion of contact 94 is formed in contact with electrically conductive material 64F, an Ohmic contact portion of contact 94 is formed in contact with electrically conductive material 64G, an Ohmic contact portion of contact 94 is formed in contact with electrically conductive material 64H, and an Ohmic contact portion of contact 94 is formed in contact with electrically conductive material 64I.

Figure 20:
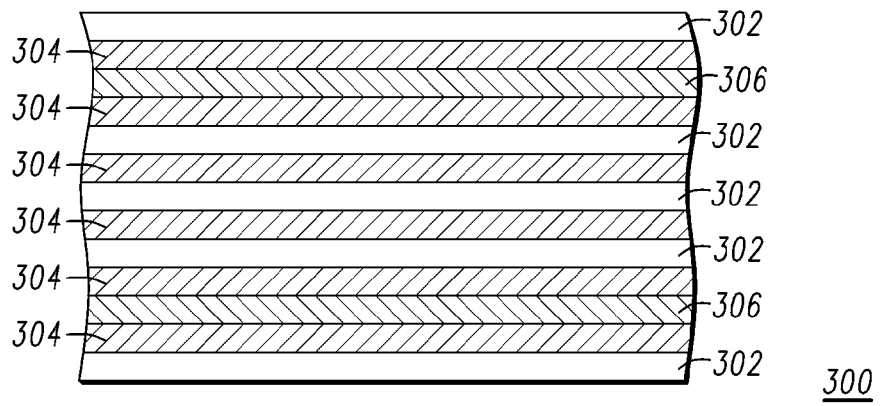
FIG. 20 is a top view of a frequency of a number of multi-concentration doped region in accordance with another embodiment of the present invention.

FIG. 20 is a top view of a Schottky device illustrating the frequency of multi-concentration doped regions in accordance with an embodiment of the present invention. What is shown in FIG. 20 is a Schottky device having a multi-concentration profile at a ratio of 2:1, i.e., the ratio represents the number of trenches that do not touch any mutt-concentration doped regions. Regions 302 are active mesa regions, regions 304 illustrate regions having trenches, and regions 306 illustrate regions of enhanced doping. Alternatively, the multi-concentration doped region frequency may refer to a percentage of the active region, a 25% frequency. Thus, in a 2:1 Schottky structure, 25% of the active mesa regions include multi-concentration doped regions.

Figure 21:
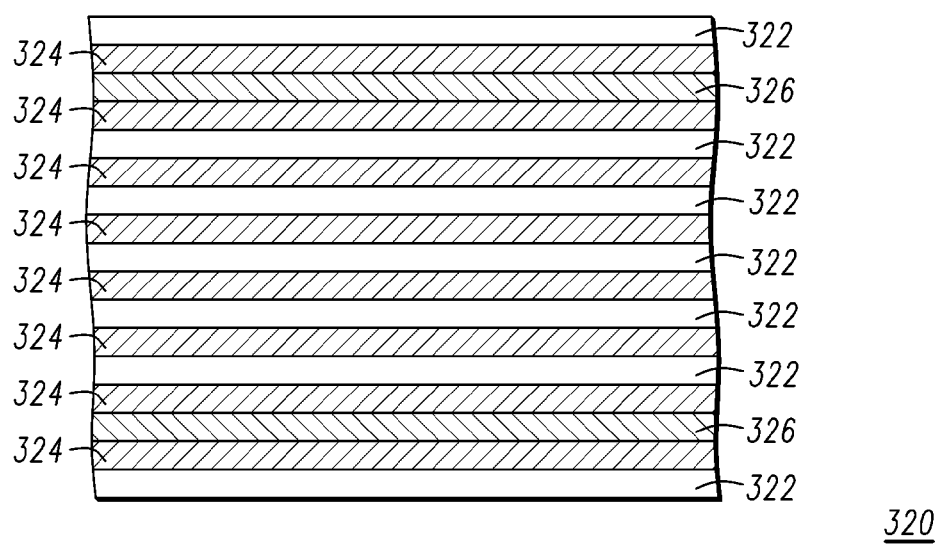
FIG. 21 is atop view of a frequency of a number of multi-concentration doped region in accordance with another embodiment of the present invention.

FIG. 21 is a top view of a Schottky device 300 illustrating the frequency of multi-concentration doped regions in accordance with another embodiment of the present invention. What is shown in FIG. 21 is a Schottky device having a multi-concentration profile at a ratio of 4:1, i.e., the ratio represents the number of trenches that do not touch any mutt-concentration doped region. Regions 322 are active mesa regions, regions 324 illustrate regions having trenches, and regions 326 illustrate regions of enhanced doping. Alternatively, the multi-concentration doped region frequency may refer to a percentage of the active region, e.g., a 16.7% frequency. Thus, in a 2:1 Schottky structure, 25% of the active mesa regions include multi-concentration doped regions.

Figure 22:
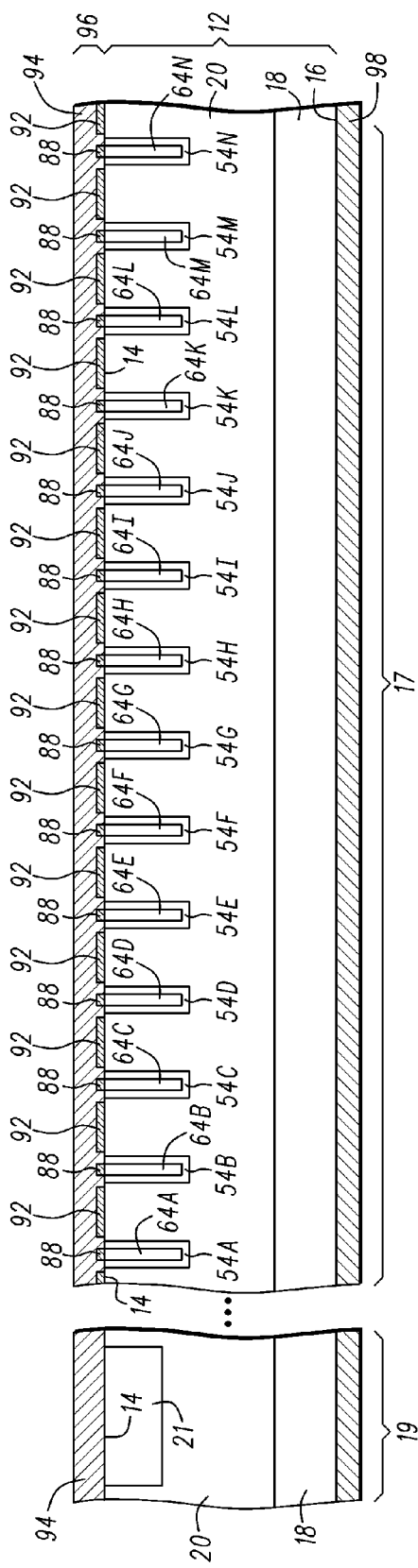
FIG. 22 is a cross-sectional view of a Schottky device in accordance with another embodiment of the present invention.

FIG. 22 is a cross-sectional view of a Schottky device 350 in accordance with another embodiment of the present invention. What is shown in FIG. 22 is a semiconductor material 12 having trenches 50A-50N lined with dielectric layers 54A-54N, and containing polysilicon fill material 64A-64N, respectively, as described with reference to FIGS. 1-9. Schottky device 350 differs from Schottky device 10 by the absence of doped regions 32A-32G and 82A-82G. Rather, than the Schottky characteristics being modulated by impurity materials such those of doped regions 32A-32G and 82A-82G, they are controlled by the conductive materials of silicide layers 92, the bather metal layers, and the conductor 94.

By now it should be appreciated that a semiconductor component such as, for example a Schottky device and methods for manufacturing the semiconductor component have been provided. Manufacturing Schottky devices in accordance with embodiments of the present invention lowers the forward voltage, lowers the leakage current that results from a pinch-off action of the trench-MOS regions, and increases the breakdown voltage of the Schottky devices. The electrical characteristics can be further optimized by forming the doped regions having the multi-concentration impurity profiles, i.e., that include doped regions 32A-32G and doped regions 82A-82F, in one or more mesa structures. For example, a doped region, such as for example a set of doped regions 32A and 82A may be formed in a mesa structure. Alternatively, a set of doped regions such as, for example, doped regions 32A and 82A may be formed in a mesa structure, a set of doped regions such as, for example, doped regions 32B and 82B may be formed in another mesa structure, and yet another a set of doped regions such as, for example, doped regions 32C and 82C may be formed in yet another mesa structure, etc. The number of mesa structures having doped regions with multi-concentration impurity material profiles is not a limitation of the present invention, i.e., there may be one, two, three, or more mesa structures that have doped regions with multi-concentration impurity material profiles.

Formation of doped regions such doped regions 32A-32G and enhanced doped regions such as regions 82A-82G reduce the forward voltage, VF, of a Schottky device because they inject minority carriers during high current levels and modulate the conductivity of the epitaxial layer. The amount of conductivity modulation and the amount of improvement in the forward voltage can be controlled by the dose and frequency of mesa structures having the doped regions, i.e., doped regions 32A-32G and 82A-82G. Another advantage is that the breakdown voltage of the Schottky devices can be improved with minimal impact on the forward voltage and vice versa.

Although certain preferred embodiments and methods have been disclosed herein, it will be apparent from the foregoing disclosure to those skilled in the art that variations and modifications of such embodiments and methods may be made without departing from the spirit and scope of the invention. For example, epitaxial layer 20 may be of P-type conductivity and doped regions 32A-32G and 82A-82G may be of N-type conductivity. It is intended that the invention shall be limited only to the extent required by the appended claims and the rules and principles of applicable law.

What is claimed is:
1. A Schottky device, comprising:
a semiconductor material of a first conductivity type having first and second major surfaces and a first concentration;

a first trench having sidewalls and a floor, the first trench extending from the first major surface of the semiconductor material into a first portion of the semiconductor material;

a second trench having sidewalls and a floor, the second trench extending from the first major surface of the semiconductor material into a second portion of the semiconductor material, wherein a third portion of the semiconductor material is between the first and second trenches and a seventh portion of the semiconductor material is adjacent the second trench, and wherein the third portion of the semiconductor material has a multi-concentration impurity profile comprising a first doped region of a second conductivity type and a second concentration extending from the first major surface of the semiconductor material into the third portion of the semiconductor material and a second doped region of the second conductivity type and a third concentration extending from the first doped region into the third portion of the semiconductor material, wherein a bottom of the second doped region is closer to the floor of the first trench than to the first major surface of the semiconductor material, and wherein the second concentration and the third concentration are selected so that a first portion of a first contact formed in contact with the third portion of the semiconductor material forms a first multi-concentration contact portion of the first contact and has electrical properties between a conventional Schottky contact and a conventional Ohmic contact, without being a conventional Schottky contact or a conventional Ohmic contact;

the first contact formed in contact with the first major surface of the semiconductor material, the first portion of the first contact in contact with the third portion of the semiconductor material and a second portion of the first contact in contact with the seventh portion of the semiconductor material, wherein the first concentration is selected so that the second portion of the first contact forms a first Schottky contact portion of the first contact; and a second contact formed in contact with the second major surface of the semiconductor material.

2. The Schottky device of claim 1, wherein the first doped region comprises a first impurity material of the second conductivity type that extends into the semiconductor material a first distance and the second doped region comprises a second impurity material of the second conductivity type that extends into the semiconductor material a second distance, the first distance less than the second distance and the concentration of the first impurity material greater than the concentration of the second impurity material.

3. The Schottky device of claim 1, further including:
a first layer of dielectric material on the sidewalls and the floor of the first trench; and
a first electrically conductive material on the first layer of dielectric material, wherein a third portion of the first contact is in contact with the first electrically conductive material in the first trench forming a first Ohmic contact portion of the first contact.

4. The Schottky device of claim 3, wherein the first electrically conductive material is a first semiconductor material of the first conductivity type.

5. The Schottky device of claim 3, further including:
a third trench having sidewalls and a floor, the third trench extending from the first major surface of the semiconductor material into a fourth portion of the semiconductor material, the seventh portion of the semiconductor material between the second trench and the third trench;
a second layer of dielectric material on the sidewalls and the floor of the second trench;
a second electrically conductive material on the second layer of dielectric material; and wherein
the first contact includes a fourth portion in contact with the second electrically conductive material to form a second Ohmic contact portion of the first contact.

6. The Schottky device of claim 5, further including
a fourth trench having sidewalls and a floor, the fourth trench extending from the first major surface of the semiconductor material into a fifth portion of the semiconductor material, wherein a sixth portion of the semiconductor material is between the third and fourth trenches, and wherein the sixth portion of the semiconductor material has a multi-concentration impurity profile comprising a third doped region of the second conductivity type and the second concentration extending from the first major surface of the semiconductor material into the sixth portion of the semiconductor material and a fourth doped region of the second conductivity type and the third concentration extending from the third doped region into the sixth portion of the semiconductor material, wherein the second concentration and the third concentration are selected so that a fifth portion of a first contact formed in contact with the sixth portion of the semiconductor material forms a second multi-concentration contact portion of the first contact and has electrical properties between a conventional Schottky contact and a conventional Ohmic contact, without being a conventional Schottky contact or a conventional Ohmic contact.

7. A Schottky device, comprising:
a semiconductor material of a first conductivity type having first and second major surfaces;
a plurality of trenches extending from the first major surface into the semiconductor material, wherein the plurality of trenches comprises at least first, second, and third trenches, the first trench having first and second sidewalls and a floor and the second trench having first and second sidewalls and a floor, wherein a first portion of the semiconductor material is between the first and second trenches, a second portion of the semiconductor material is between the second and third trenches, and a third portion of the semiconductor material is adjacent a side of the third trench;
a first layer of dielectric material on the first and second sidewalls and the floor of the first trench;
a first electrically conductive material on the first layer of dielectric material;
a second layer of dielectric material on the first and second sidewalls and the floor of the second trench;
a second electrically conductive material on the second layer of dielectric material;
a conductivity modulation means that modulates conductivity in the first portion of the semiconductor material and the third portion of the semiconductor material, wherein the conductivity modulation means includes a first multi-concentration impurity profile comprising a first doped region of a second conductivity type and a first concentration extending a first distance from the first major surface of the semiconductor material into the first portion of the semiconductor material and in direct contact with the second sidewall of the first trench and the first sidewall of the second trench, and a second doped region of the second conductivity type and a second concentration extending from the first doped region into the first portion of the semiconductor material, wherein a bottom of the second doped region is closer to the floor of the first trench than to the first major surface of the semiconductor material, and wherein the first concentration is selected so that a first portion of a first contact formed in contact with the first portion of the semiconductor material has electrical properties between a conventional Schottky contact and a conventional Ohmic contact, without being a conventional Schottky contact or a conventional Ohmic contact; and a second portion of the first contact in contact with the first electrically conductive material in the first trench to form a first ohmic contact portion of the first contact.

8. The Schottky device of claim 7, wherein the first concentration is greater than the second concentration.

9. The Schottky device of claim 8, wherein the plurality of trenches further comprises fourth, fifth, sixth, and seventh trenches, wherein the third portion of the semiconductor material is between the third and fourth trenches, a fourth portion of the semiconductor material is between the fourth and fifth trenches, a fifth portion of the semiconductor material is between the fifth and sixth trenches, and a sixth portion of the semiconductor material is between the sixth and seventh trenches, and wherein the conductivity modulation means comprises a second multi-concentration impurity material profile having a third doped region of the second conductivity type and the first concentration extending from the first major surface of the semiconductor material into the third portion of the semiconductor material and a fourth doped region of the second conductivity type and the second concentration that extends from the third doped region into the third portion of the semiconductor material.

10. The Schottky device of claim 8, wherein the first multi-concentration impurity material profile is a stepped dopant profile.

11. The Schottky device of claim 7, wherein the first portion of the semiconductor material is configured to be a first mesa structure and the second portion of the semiconductor material is configured to be a second mesa structure.

12. The Schottky device of claim 7, wherein the second trench contacts the first portion of the semiconductor material and the third trench contacts the second portion of the semiconductor material.

13. The Schottky device of claim 7, wherein the conductivity modulation means further includes: a second multi-concentration impurity profile having a third doped region of the second conductivity type and the first concentration extending from the first major surface of the semiconductor material into the third portion of the semiconductor material and a fourth doped region of the second conductivity type and the second concentration extending from the third doped region into the third portion of the semiconductor material, wherein the first concentration and the second concentration are selected so that a third portion of the first contact formed in contact with the third portion of the semiconductor material has electrical properties between a conventional Schottky contact and a conventional Ohmic contact, without being a conventional Schottky contact or a conventional Ohmic contact, a fourth portion of the first contact in contact with the second electrically conductive material to form a second ohmic contact portion of the first contact, and a fifth portion of the first contact in contact with the second portion of the semiconductor material to form a Schottky contact portion of the first contact.

14. A semiconductor component, comprising:

a semiconductor material of a first conductivity type having first and second major surfaces and a first concentration;

a first concentric trench having sidewalls and a floor, the first concentric trench extending from the first major surface of the semiconductor material into a first portion of the semiconductor material;

a second concentric trench having sidewalls and a floor, the second concentric trench extending from the first major surface of the semiconductor material into a second portion of the semiconductor material, wherein a first multi-concentration contact portion of the semiconductor material is between the first concentric trench and the second concentric trench and has a first multi-concentration impurity profile, and wherein the first multi-concentration impurity profile comprises a first doped region of a second conductivity type and a second concentration extending from the first major surface of the semiconductor material into the first multi-concentration contact portion of the semiconductor material and in direct contact with a first sidewall of the first trench and a first sidewall of the second trench, and a second doped region of the second conductivity type and a third concentration extending from the first doped region into the first multi-concentration contact portion of the semiconductor material, wherein a bottom of the second doped region is closer to the floor of the first concentric trench than to the first major surface of the semiconductor material, wherein the second concentration and the third concentration are selected so that a first portion of a first contact is formed in contact with the first multi-concentration contact portion of the semiconductor material and has electrical properties between a conventional Schottky contact and a conventional Ohmic contact, without being a conventional Schottky contact or a conventional Ohmic contact; and one of a first Schottky contact portion or a first Ohmic contact portion formed from a second portion of the first contact.

15. The semiconductor component of claim 14, further including:

a third concentric trench having sidewalls and a floor, the third concentric trench extending from the first major surface of the semiconductor material into a third portion of the semiconductor material, wherein a second multi-concentration contact portion of the semiconductor material is adjacent the third concentric trench and has a second multi-concentration impurity profile, and wherein the second multi-concentration impurity profile comprises a third doped region of the second conductivity type and the second concentration extending from the first major surface of the semiconductor material into the second multi-concentration contact portion of the semiconductor material and a fourth doped region of the second conductivity type and the third concentration extending from the third doped region into the second multi-concentration contact portion of the semiconductor material, wherein the second concentration and the third concentration are selected so that a second portion of the first contact is formed in contact with the second multi-concentration contact portion of the semiconductor material and has electrical properties between a conventional Schottky contact and a conventional Ohmic contact, without being a conventional Schottky contact or a conventional Ohmic contact; and wherein the first Schottky contact portion of the first contact is formed in contact with a portion of the semiconductor material adjacent the second concentric trench.

16. The semiconductor component of claim 15, further including:

a fourth concentric trench having sidewalls and a floor, the fourth concentric trench extending from the first major surface of the semiconductor material into a fourth portion of the semiconductor material; and a fifth concentric trench having sidewalls and a floor, the fifth concentric trench extending from the major surface of the semiconductor material into a fifth portion of the semiconductor material, wherein the fourth concentric trench and the fifth concentric trench are laterally positioned between the second concentric trench and the third concentric trench.

17. The semiconductor component of claim 16, wherein the first Schottky contact region of the semiconductor material is between the fourth concentric trench and the second concentric trench, and wherein the first Schottky contact portion of the first contact is formed in contact with the first Schottky region of the semiconductor material.

18. The semiconductor component of claim 17, wherein a second Schottky contact region of the semiconductor material is between the fifth concentric trench and the third concentric trench and wherein a second Schottky contact portion of the first contact is formed in contact with the second Schottky region of the semiconductor material.

19. The semiconductor component of claim 14, further including:

a first layer of dielectric material on the sidewalls and the floor of the first concentric trench;

a first electrically conductive material on the first layer of dielectric material; and wherein the first Ohmic contact portion of the first contact formed in contact with the first electrically conductive material.

20. The semiconductor component of claim 19, wherein the first electrically conductive material comprises polysilicon of the first conductivity type.

* * * * *